United States Patent [19]

Iizuka

[11] Patent Number: 4,532,609
[45] Date of Patent: Jul. 30, 1985

[54] SEMICONDUCTOR MEMORY DEVICE

[75] Inventor: Tetsuya Iizuka, Funabashi, Japan

[73] Assignee: Tokyo Shibaura Denki Kabushiki Kaisha, Japan

[21] Appl. No.: 504,125

[22] Filed: Jun. 14, 1983

[30] Foreign Application Priority Data

Jun. 15, 1982 [JP] Japan .................................. 57-102835
Mar. 10, 1983 [JP] Japan .................................. 58-39551

[51] Int. Cl.³ ............................................. G11C 11/40
[52] U.S. Cl. ..................................... 365/154; 365/189
[58] Field of Search ........................ 365/154, 182, 189

[56] References Cited

U.S. PATENT DOCUMENTS 3,540,010 11/1970 Heightley et al. ................... 365/154
3,560,764 2/1971 McDowell ........................... 365/154
4,314,359 2/1982 Kato et al. ............................ 365/179

FOREIGN PATENT DOCUMENTS 2039145 7/1980 United Kingdom ................ 365/154

OTHER PUBLICATIONS

Brodsky, "Hardening RAMs Against Soft Errors," Electronics, pp. 117-122, Apr. 24, 1980.
Hu, "Drift Collection of Alpha Generated Carriers and Design Implications," ISSCC Digest of Technical Papers, pp. 18-19, Feb. 10, 1982.
Hsieh, et al., "Dynamics of Charge Collection from Alpha-Particle Tracks in Integrated Circuits," Int. Reliability Phys. Symp. Proceedings, pp. 38-42 (1981).

Primary Examiner—James W. Moffitt
Attorney, Agent, or Firm—Finnegan, Henderson, Farabow, Garrett & Dunner

[57] ABSTRACT

A semiconductor memory device comprises a flip-flop circuit composed of two inverters each including two series-connected resistors as load elements, the input and output terminals of one of the inverters are respectively connected to the output and input terminals of the other inverter, and two capacitors whose first terminals are connected to the junctions of the two resistors and whose second terminals are connected to the output terminals of the two inverters.

10 Claims, 9 Drawing Figures

SEMICONDUCTOR MEMORY DEVICE

BACKGROUND OF THE INVENTION

The present invention relates to a semiconductor memory device having improved reliability which can prevent the occurrence of a soft error due to the incidence of alpha particles.

Figure 1:
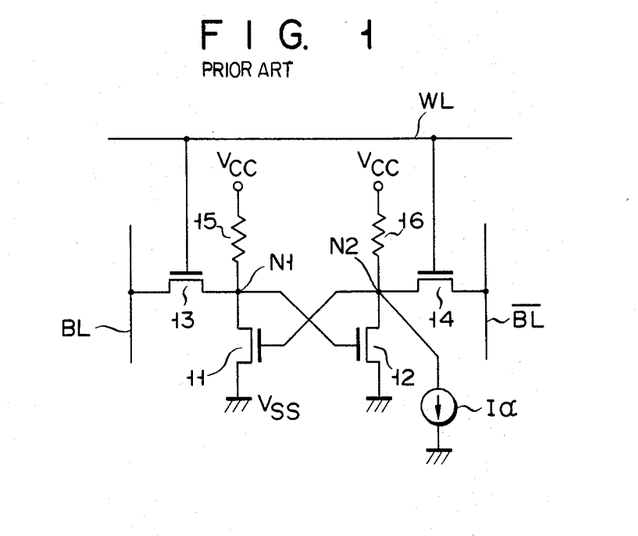
FIG. 1 is a circuit diagram of a prior semiconductor memory device of the static type.

Semiconductor memory devices are generally categorized into dynamic and static type memory devices. In the dynamic type memory device, each memory cell is composed of a single capacitor and a single MOS (metal oxide semiconductor) transistor. In the static type memory device, each memory cell is composed of four transistors 11 to 14 and two load resistors 15 and 16. In FIG. 1, characters BL and $\overline{BL}$ indicate a pair of bit lines and WL a word line.

In the semiconductor memory device of the dynamic type, data is kept by storing a charge in the capacitor. For this reason, since the elements are very small, the quantity of stored charges is quite small. With such minute charges stored, the data tends to be destroyed upon external application of alpha particles.

Figure 2:
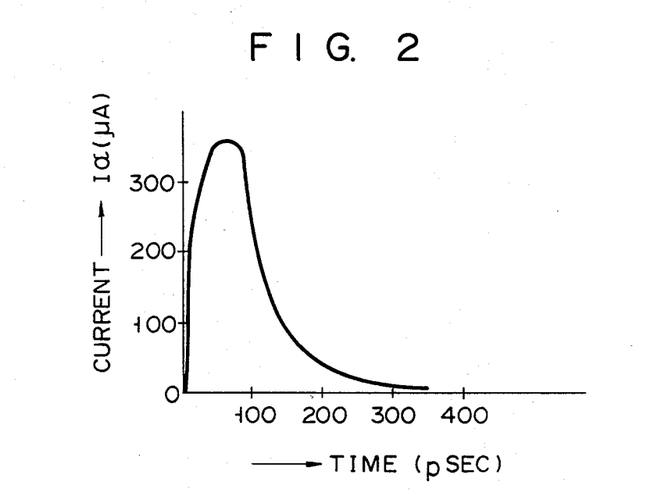
FIG. 2 shows a waveform of a radio wave pulse caused by the incidence of alpha particles.

The static type semiconductor memory device is constructed so as to hold data by always feeding current through a resistor (15 or 16 in FIG. 1). Because of this feature, in the static type semiconductor memory device, the occurrence of a soft error is less frequent than in the dynamic type semiconductor memory device. Nevertheless, miniaturization and low power dissipation of the elements of the semiconductor memory device increases the probability that a soft error will occur. More specifically, in a static type semiconductor memory device as shown in FIG. 1, as the degree of miniaturization increases, stray capacitances at the nodes N1 and N2 of load resistors 15 and 16 and drive transistors 11 and 12 become smaller. The integration density of a semiconductor chip reflecting the present stage of semiconductor technology allows the stray capacitance at the node N2 to be approximately 10 fF ($10 \times 10^{-15}$ F) and hence, a quantity of charges allowed to be stored at the node N2 is 50 fC ($50 \times 10^{-15}$ C) at the most. When alpha particles are incident on a semiconductor region corresponding to the node N2, a current $I_\alpha$ flows along a path between the node N2 and ground. As shown in FIG. 2, the current $I_\alpha$ is a pulsative current with a very narrow width, its peak 1 value is 300–400 µA, and the total quantity of its charge reaches 100 fC. Thus, the total quantity of the charge of the current $I_\alpha$ is remarkably larger than the quantity of charge stored in the node N2. Therefore, the flow of the current into the node N2 results in destruction of the data stored therein. Further, the decreased power dissipation necessitates an extreme increase in resistance of the resistors 15 and 16 (up to the order of giga-ohms). The result is that the current flowing from the power source $V_{CC}$ into the node N2 becomes small, and hence, the quantity of charge stored in the node N2 also becomes small. This implies that the stored data is more easily destroyed by alpha particles.

SUMMARY OF THE INVENTION

Accordingly, an object of the present invention is to provide a semiconductor memory device which can prevent stored data from being destroyed by the incident alpha particles and hence, improve the reliability of the device.

According to the invention, there is provided a iconductor memory device comprising:

a first MOS transistor and a first load resistor connected in series between a power source voltage and a reference voltage;

a second MOS transistor and a second load resistor connected in series between the power source voltage and the reference voltage;

first connecting means for interconnecting the output node of said first MOS transistor and the gate of said second MOS transistor through a third resistor;

second connecting means for interconnecting the output node of said second MOS transistor and the gate of said first MOS transistor through a fourth resistor; and third and fourth MOS transistors for data transfer in which said third MOS transistor is connected between a first bit line and the output node of said first MOS transistor, said fourth MOS transistor is connected between a second bit line and the output node of said second MOS transistor, and the gates of said third and fourth MOS transistors are connected to a common word line;

wherein the following relations hold $$\frac{C2}{C1} < 2 \frac{V_o - V_{TN}}{V_{TN}}$$

$$\ln\left(\frac{1}{\left(1 + \frac{C2}{2C1}\right)\frac{V_{TN}}{V_o}}\right) > \frac{t_d}{C1R2}$$

$$C1R2 < t_w$$

wherein
R2: resistance of each of said third and fourth resistors,
C1: capacitance on said gate electrode node,
C2: capacitance on the output electrode node of each of said first and second MOS transistors,
$V_o$: high level potential on the output electrode node of said first and second MOS transistors,
$V_{TN}$: minimum value of a potential difference appearing between the output nodes of said first and second MOS transistors, with said potential difference the logical "1", "0" states of the output electrode nodes N1 and N2 can return to the steady state;
$t_d$: time until the electric current pulse generated due to the incidence of the high energy particles disappears; and
$t_w$: minimum value of the pulse width of a write designating signal.

DETAILED DESCRIPTION OF THE PREFERRED EMBODIMENTS

Figure 3:
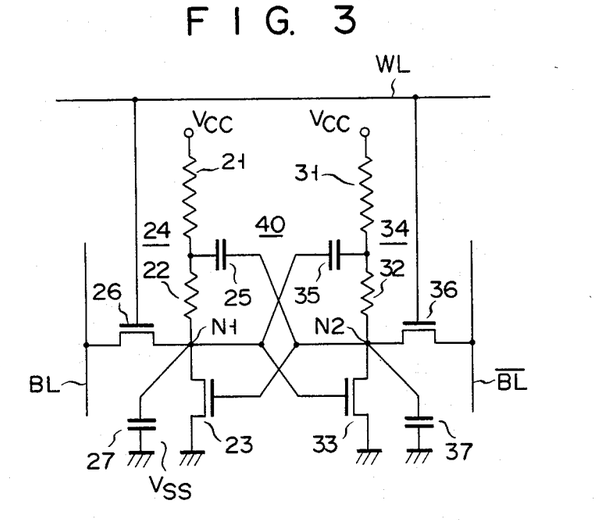
FIG. 3 is a circuit diagram of an embodiment of a semiconductor memory device according to the present invention.

FIG. 3 shows an embodiment of a semiconductor memory device according to the present invention. In FIG. 3, a first series circuit comprises a pair of resistors 21 and 22 and a MOS transistor 23 connected between the power source voltage $V_{CC}$ and the reference voltage $V_{SS}$ or ground. The resistors 21 and 22 and the MOS transistor 23 are connected in this order between the power source voltage $V_{CC}$ and the reference voltage $V_{SS}$. The resistors 21 and 22 and the MOS transistor 23 cooperate to form a first inverter 24 in which the resistors 21 and 22 are used as a load and the MOS transistor 23 as a driver. A junction point of the resistor 22 and the MOS transistor 23 is used as an output electrode node N1. As in the case of the first series circuit, a second series circuit comprised of resistors 31 and 32 and a MOS transistor 33, is inserted between the power source voltage $V_{CC}$ and the reference voltage $V_{SS}$. The resistors 31 and 32 and the MOS transistor 33 are connected, in this order, to the power source voltage $V_{CC}$. These resistors 31 and 32 and the MOS transistor 33 form a second inverter 34, in which the resistors 31 and 32 serve as a load and the MOS transistor 33 as a driver. A junction point between the resistor 32 and the MOS transistor 33 is used as an output electrode node N2 of the second inverter 34. The output node N1 of the inverter 24 is connected to the gate of the transistor 33 as an input node of the second inverter 34. The output node N2 of the inverter 34 is connected to the gate of the transistor 23 as an input node of the inverter 24. The two inverters 24 and 34 are crossed such that the input node of one of the inverters is connected to the output node of the other, thereby forming a flip-flop 40 for storing one-bit data.

An interconnection point between the resistors 21 and 22 is connected to one end of a capacitor 25 whose output is connected to an output node N2 of the inverter 34. Similarly, an interconnection point between the resistors 31 and 32 is connected to one end of a capacitor 35 whose other end is connected to an output node N1 of the inverter 24.

A MOS transistor 26 is connected between the output node N1 of the inverter 24 and a bit line BL. Similarly, a MOS transistor 36 for data transfer is provided between an output node N2 of the inverter 34 and the other bit line $\overline{BL}$. The gates of the MOS transistors 26 and 36 are connected together and to the word line WL.

A capacitance 27 exists between the output node N1 of the inverter 24 and the reference voltage $V_{SS}$. The capacitance 27 generally represents various types of capacitances present at the node N1, such as the junction capacitances between the sources of the transistors 23 and 26 and the substrate and between the drains thereof and the substrate, and gate capacitances of the transistors 23 and 26. Similarly, a capacitance 37 exists between the output node of the inverter 34 and ground, and is generally representative of various types of capacitances existing therebetween, such as junction capacitances between the sources of the transistors 33 and 36 and the substrate, and between the drains of these transistors and the substrate, and the gate capacitances of these transistors.

In the circuit diagram of FIG. 3, the MOS transistors are all of the enhancement, n-channel type.

In FIG. 3, resistances of the resistors 21 and 22 and the resistors 31 and 32 are set at R1 to R4, and the capacitances of the capacitors 25 and 35 at C1 and C3, respectively. The capacitances of the capacitors 27 and 37 are set at C2 and C4, respectively.

The minimum potential difference $V_{TN}$ may vary according to various factors pertaining to the transistors 23 and 33, e.g. channel width, impurity concentration, etc. However, $V_{TN}$ is generally about half the threshold voltage.

In this embodiment, when R1>R2 and R3>R4, various types of parameters are selected so as to satisfy the following inequalities.

$$\frac{C2}{C1} < 2\frac{V_o - V_{TN}}{V_{TN}} \tag{1}$$

$$\frac{C4}{C3} < 2\frac{V_o - V_{TN}}{V_{TN}} \tag{2}$$

$$\ln\left\{\frac{1}{\left(1 + \frac{C2}{2C1}\right)\frac{V_{TN}}{V_o}}\right\} > \frac{t_d}{C1R2} \tag{3}$$

$$\ln\left\{\frac{1}{\left(1 + \frac{C4}{2C3}\right)\frac{V_{TN}}{V_o}}\right\} > \frac{t_d}{C3R4} \tag{4}$$

$$C1R2 < t_w \tag{5}$$

$$C3R4 < t_w \tag{6}$$

where $V_o$: high level potential at the output node N1 or N2, $V_{TN}$: minimum value of a potential difference between the nodes N1 and N2. Logical "1", "0" states of the output electrode nodes N1 and N2 can be returned to a steady state when the potential difference is above the minimum, $t_d$: time taken until the electric current pulse formed due to the incidence of alpha particles disappears, and $t_w$: minimum value of the pulse width of a write mode designating signal.

The operation of the FIG. 3 circuit thus arranged will now be described.

In the description to follow, it is assumed that R1>R2 and R3>R4. A low logic level ("L" level) and a high logic level ("H" level) are applied to the bit lines BL and $\overline{BL}$, respectively. Further, a write mode designating signal (R/W) at "H" level is input to the word line WL to set up a data write mode. Upon receipt of the high level R/W signal, both the MOS transistors 26 and 36 are turned on. Then, the "H" and "L" level signals on the bit lines BL and $\overline{BL}$, respectively, render the nodes N1 and N2 "L" and "H" level, respectively. Afterwards, the R/W signal is set at "L" level, so that the MOS transistors 26 and 36 are both turned off. At this point, the write operation is completed. In this way, the data of "L" level has been written into the node N1 and the data of "H" level has been written into the node N2. That is, the flip-flop 40 is set to "0" level at the node N1 and "1" level at the node N2. The capacitor 37 is charged with a higher potential at the portion thereof which is closer to the node N2.

Under this condition, it is assumed that alpha particles are incident upon the semiconductor area corresponding to the node N2 or the semiconductor region near this node, and the negative charge flows into the node N2 keeping "H" level data therein. At the present stage of semiconductor technology, the capacitance C4 of the capacitor 37 connected to the node N2 is 15 faF, so that the quantity of charges to be stored in the capacitor 37 is approximately 75 fC. On the other hand, the quantity of charges caused by the incidence of the alpha particles is approximately 100 fC, which is much larger than the stored charge 75 fC. For this reason, the charge stored in the capacitor 37 is nearly discharged within the period corresponding to the pulse width $t_d$ of the pulsative current $I_\alpha$ generated upon the incidence of the alpha particles. The quantity of charge stored in the capacitor becomes smaller with the increase in the integration density of the IC chip. The charge quantity caused by the incidence of alpha particles depends very little on the improvement of the integration density, i.e., the miniaturization of the elements. In other words, it should not be expected that it will be decreased by miniaturizing the elements. With the further miniaturization of the elements in the future, the charges stored in the capacitor 37 will be almost fully discharged within the period of the pulse width $t_d$ of the current $I_\alpha$ arising from the incidence of the alpha particles.

In a write mode, not only the capacitor 37 but also the capacitors 25 and 35 are charged with high potential at the portion closer to the node N2. During the discharge period of the capacitor 37, the capacitors 25 and 35 are discharged toward the node N2. As will be recalled, since R1>R2, the charge in the capacitor 25 is discharged through the resistor 22. Further, since R3>R4, the charge in the capacitor 35 is discharged through a resistor 32. When the discharge of the capacitor 37 terminates, that is, the time period of the pulse width $t_d$ of the pulse current $I_\alpha$ from the alpha particles terminates, the quantities of the residual charges in the capacitors 25 and 35 are expressed by $\exp(-t_d/C1R2)$ and $\exp(-t_d/C3R4)$, respectively. The resistances R1 and R3 of the resistors 21 and 31 are set on the order of giga-ohms to provide for power-saving of the device. Therefore, the quantity of the charge from the power source voltage $V_{CC}$ to the node N2 through the resistors 21 and 31 is almost negligible.

Therefore, the potential on a node N2 after an interval several times the pulse width $t_d$ of the current $I_\alpha$ is substantially determined only by a redistribution of charges by three capacitors 25, 35 and 37. If C1≃C2, the potential on the node N2 at the above time point is given by $2V_oC3\ e^{-t_d/C3R4}/(2C3+C4)$. If the potential of the node N2 falls below the threshold voltage of the transistor 23, the transistor 23 is turned off. That is, the "1" or "0" state of the flip-flop 40 becomes an unsteady state. If, however, the potential at the node N2 after the charge redistribution is higher than the minimum potential difference $V_{TN}$, the transistor 23 is again turned on. That is, the flip-flop 40 returns to the original state. The reason for this is as follows. When the transistor 23 is turned on, the nodes N1 and N2 are charged through the resistors 21, 22 and 31, 32, respectively, by the power source $V_{CC}$. In this case, if the potential of the node N2 is higher by $V_{TN}$ than that of the node N1, the node N2 is charged to the threshold voltage of the transistor 23 before the node N1 is charged to the threshold voltage of the transistor 23. As a result, the transistor 23 is turned on, and thus the flip-flop 40 returns to the original state. In other words, "high" level data on the node N2 is preserved since it is not destroyed through the discharge following the incidence of alpha particles. Thus, the incidence of the alpha particles does not lead to destruction of data or generation of an error.

Generally, to avoid the destruction of data, it is necessary that the potential $V_{TN}$ at the node N2 after the charge redistribution be higher than that on the node N1 of the MOS transistor 23, as described above and given below.

$$V_{TN} < 2V_oC3\ e^{-t_d/C3R4}/(2C3+C4) \quad (7)$$

Rearranging inequality (7), we have a conditional inequality of which one side does not contain Vo and $V_{TN}$. Multiplying both sides of inequality (7) by $(2C3+C4)/2V_oC3$, we can derive the following inequality (8)

$$V_{TN}\frac{2C3+C4}{2V_oC3} < e^{-t_d/C3R4} \quad (8)$$

Applying a logarithm to both sides of inequality (8), we have $$\ln\left(V_{TN}\frac{2C3+C4}{2V_oC3}\right) < -\frac{t_d}{C3R4} \quad (9)$$

When both sides of inequality (9) are divided by −1, it is rearranged as follows:

$$\ln\left(\frac{1}{V_{TN}}\frac{2V_oC3}{2C3+C4}\right) > \frac{t_d}{C3R4} \quad (10)$$

Further rearranging inequality (10) gives the following relation (11).

$$\ln\left\{\frac{1}{\left(1+\frac{C4}{2C3}\right)\frac{V_{TN}}{V_o}}\right\} > \frac{t_d}{C3R4} \quad (11)$$

In the above inequality (8), $e^{-t_d/C3R4}$ on the right side has a value between 0 and 1. This indicates that the $V_{TN}/V_o$ on the left side in inequality (8) is less than 1. Therefore, an inequality (12) holds $$\frac{V_{TN}}{V_o}\frac{2C3+C4}{2C3} < 1 \quad (12)$$

By dividing both sides of inequality (12) by $V_{TN}/V_o$, we have $$\frac{C4}{C3} < 2\left(\frac{V_o - V_{TN}}{V_{TN}}\right) \quad (13)$$

By selecting $t_d$, R4, C3 and C4 so as to satisfy inequalities (11) and (13), the potential $V_{TN}$ on the node N2 which has stored high level data after the charge redistribution is set higher than the potential on the output node N1 of the transistor 23. With this potential setting, even when the current $I_\alpha$ flows into the node N2 due to the incidence of the current $I_\alpha$, the data stored in node N2 is protected. Further, note that inequalities (11) and (13) are equal to (4) and (2).

Let us consider a case opposite to the one above. In this case, when "high" level data is stored in the node N1, upon receipt of the alpha particles, negative charges, or the current $I_\alpha$, flows into the node N1. At this time, the charges are redistributed, after the capacitor 27 is discharged, by the three capacitors 25, 35 and 27. The potential on the node N1 after the charge redistribution is $$2V_oC1\ e^{-t_d/C1R2}/(2C1+C2) \qquad (10)$$

If the potential of the node N1 after the charge redistribution is higher than the minimum potential difference $V_{TN}$, the "high" level data on the node N1 is kept as it is, through the process such as at the node N2. To avoid the destruction of the data, the potential on the node N1 after the charge redistribution must be higher than the minimum potential difference $V_{TN}$, viz. the following relation must be satisfied $$V_{TN} < 2V_oC1\ e^{-t_d/C1R2}/(2C1+C2)$$

Rearranging this inequality in the same manner as in the node N2, we have the relations (14) and (15):

$$\ln\left\{\frac{1}{\left(1+\frac{C2}{2C1}\right)\frac{V_{TN}}{V_o}}\right\} > \frac{t_d}{C1R2} \qquad (14)$$

$$\frac{C2}{C1} < 2\left(\frac{V_o - V_{TN}}{V_{TN}}\right) \qquad (15)$$

Accordingly, by selecting $t_d$, R2, C1 and C2 so as to satisfy inequalities (14) and (15), the potential on the node N1 after the charge redistribution can be set higher than the minimum potential difference $V_{TN}$. As a consequence, even when the current $I_\alpha$ flows into the node N1 due to the incidence of the alpha particles, the "high" level data held at the node N1 is not destroyed. Note here that inequalities (14) and (15) are equal to (3) and (1).

Relations (3) and (4) are for determining a minimum value of C1R2 or C3R4. If the values of C1R2 and C3R4 are set to excessively large values, a situation may occur wherein data cannot be written within a write period in a write mode. Therefore, to prevent the occurrence of such a situation, it is necessary to satisfy inequalities (5) and (6) in order to determine the maximum values of C1R2 and C3R4.

The resistors 22 and 32 may be formed by a distributed constant circuit containing the electrodes of the capacitors 25 and 35.

Figure 4:
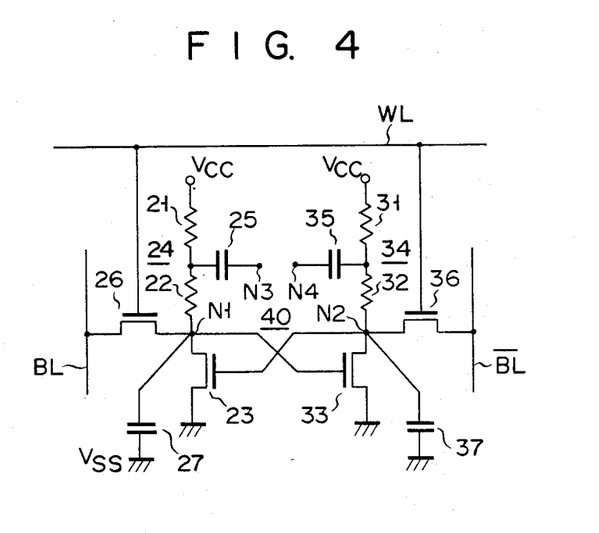
FIGS. 4 to 9 show circuit diagrams of other embodiments of a semiconductor device according to the present invention.

FIG. 4 shows a circuit diagram of another embodiment of the present invention. In this instance, first ends of the capacitors 25 and 35 are connected to nodes N3 and N4 connected to the power source voltage $V_{CC}$ and reference voltage $V_{SS}$, not the nodes N2 and N1. As a matter of course, nodes N3 and N4 may be connected to the voltages with opposite polarities or together to the reference voltage $V_{SS}$ or the power source voltage $V_{CC}$. In this embodiment, when R1>R2 and R3>R4, parameters are selected which satisfy the following relations (16)–(21).

$$\frac{C2}{C1} < \frac{V_o - V_{TN}}{V_{TN}} \qquad (16)$$

$$\frac{C4}{C3} < \frac{V_o - V_{TN}}{V_{TN}} \qquad (17)$$

$$\ln\left\{\frac{1}{\left(1+\frac{C2}{C1}\right)\frac{V_{TN}}{V_o}}\right\} > \frac{t_d}{C1R2} \qquad (18)$$

$$\ln\left\{\frac{1}{\left(1+\frac{C4}{C3}\right)\frac{V_{TN}}{V_o}}\right\} > \frac{t_d}{C3R4} \qquad (19)$$

$$C1R2 < t_w \qquad (20)$$

$$C3R4 < t_w \qquad (21)$$

In this embodiment, during the charge period of each of the capacitors 37 and 27 at the time of the alpha particles incidence, only the capacitors 35 and 25 contribute to the discharge to the node N2 or N1. Accordingly, when the "high" level data is stored in the node N2, the potential at the node N2, after the negative charges are caused by the incidence of alpha particles and flow into the node N2, is half that in the circuit of FIG. 4. As in the FIG. 3 embodiment, using the relationship of this value to the threshold voltage $V_{TN}$ of the MOS transistor 23, we have inequalities (22) and (23), which correspond to the inequalities (11) and (13), $$\ln\left\{\frac{1}{\left(1+\frac{C4}{C3}\right)\frac{V_{TN}}{V_o}}\right\} > \frac{t_d}{C3R4} \qquad (22)$$

$$\frac{C4}{C3} < \frac{V_o - V_{TN}}{V_{TN}} \qquad (23)$$

Similarly, with respect to the node N1, we can obtain the following inequalities (24) and (25) corresponding to inequalities (11) and (13).

$$\ln\left\{\frac{1}{\left(1+\frac{C2}{C1}\right)\frac{V_{TN}}{V_o}}\right\} > \frac{t_d}{C1R2} \qquad (24)$$

$$\frac{C2}{C1} < \frac{V_o - V_{TN}}{V_{TN}} \qquad (25)$$

Accordingly, by arranging a circuit so as to satisfy inequalities (22), (23), (24) and (25), the potential on the node N1 or N2 after the charge redistribution is set higher than the minimum potential difference $V_{TN}$. If the current $I_\alpha$ flows into the node N1 or N2, the "high" level data stored in the node N1 or N2 is not destroyed. Incidentally, the relations (22) and (23), and (24) and (25) are equal to (19) and (17), and (18) and (16), respectively.

The inequalities (22) and (24) are used to determine minimum values of the C1R2 and C3R4. As in the previous embodiments, if the C1R2 and C3R4 are too large, it becomes impossible to write data within the write period. To avoid such a situation, the maximum values of C1R2 and C3R4 are first selected and then C1R2 and C3R4 must be set below these maximum values. In other words, C1R2 and C3R4 must be selected so as to satisfy the inequalities (20) and (21).

Figure 5:
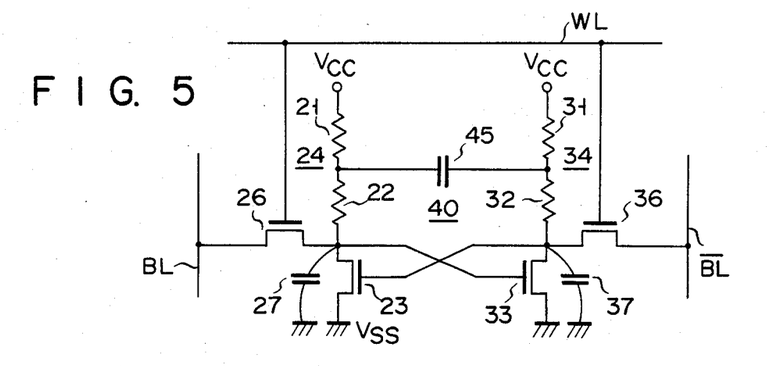

FIG. 5 shows a circuit diagram of still another embodiment of the present invention. In this embodiment, the first ends of the two capacitors in the FIG. 3 or FIG. 4 embodiment are interconnected to form a single capacitor 45. In this circuit, the capacitance of the capacitor 45 is C5 and R1>R2 and R3>R4. Under this condition, the circuit is designed to satisfy the relations (26)–(30).

$$\frac{C4}{C5} < \frac{V_o - V_{TN}}{V_{TN}} \tag{26}$$

$$\ln\left(\frac{1}{\left(1 + \frac{C2}{C5}\right)\frac{V_{TN}}{V_o}}\right) > \frac{t_d}{C5(R2 + R4)} \tag{27}$$

$$\ln\left(\frac{1}{\left(1 + \frac{C4}{C5}\right)\frac{V_{TN}}{V_o}}\right) > \frac{t_d}{C5(R2 + R4)} \tag{28}$$

$$C5R2 < t_w \tag{29}$$

$$C5R4 < t_w \tag{30}$$

In this circuit, the charge redistribution after negative charges have flowed into the nodes N1 and N2 as the result of the incidence of alpha particles is set up by the current flowing through the two resistors 22 and 32 which is caused by the discharge from the capacitor 45. As in the embodiments of FIGS. 3 and 4, solving the inequality expressing a relationship of the potentials on the nodes N1 and N2 after the charge redistribution to the minimum potential difference $V_{TN}$, we have relations equal to the relations (26)–(28). The relations giving the maximum values of the C5R2 and C5R4 are equal to the relations (29)–(30).

It should be understood that the invention is not limited to the above-mentioned embodiments, but may be changed and modified within the scope of the invention. In each of the above-mentioned embodiments, when the resistances of the load resistors 21, 22, 31 and 32 for the pair of inverters 24 and 34 are R1 to R4, these are related as follows: R1>R2 and R3>R4. Conversely, these relations of the resistances may be R1<R2 and R3<R4. To apply the latter relation to the FIG. 3 embodiment, each factor must be selected so as to satisfy the following inequalities (31)–(36), not (1)–(6).

$$\frac{C2}{C1} < \frac{V_o - V_{TN}}{V_{TN}} \tag{31}$$

$$\frac{C4}{C3} < \frac{V_o - V_{TN}}{V_{TN}} \tag{32}$$

$$\ln\left(\frac{1}{\left(1 + \frac{C2}{C1}\right)\frac{V_{TN}}{V_o}}\right) > \frac{t_d}{C1R2} \tag{33}$$

$$\ln\left(\frac{1}{\left(1 + \frac{C4}{C3}\right)\frac{V_{TN}}{V_o}}\right) > \frac{t_d}{C3R4} \tag{34}$$

$$C1R2 < t_w \tag{35}$$

$$C3R4 < t_w \tag{36}$$

The selection of factors to satisfy the above relations can, of course, prevent the occurrence of a soft error and the destruction of data due to the incidence of alpha particles.

Figure 6:
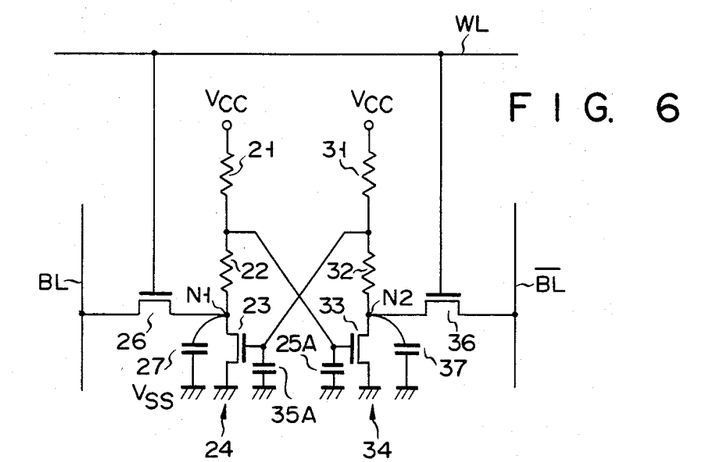

Turning now to FIG. 6, there is shown yet another embodiment of the present invention. This embodiment is not provided with capacitors 25 and 35 as are used in the FIG. 3 embodiment. Reference numerals 25A and 35A denote capacitors existing between the gate electrode nodes of the transistors 23 and 33 and ground. The gate of the HOS transistor 23 is connected to a junction between the resistors 31 and 32. The gate of the MOS transistor 33 is connected to the junction between the resistors 21 and 22. As in the FIG. 3 embodiment, if the capacitances of the capacitors 25A and 35A are C1 and C3, and R1>R2 and R3>R4, the FIG. 6 circuit must be designed so as to satisfy the following relations (37)–(42).

$$\frac{C2}{C1} < \frac{V_o - V_{TN}}{V_{TN}} \tag{37}$$

$$\frac{C4}{C3} < \frac{V_o - V_{TN}}{V_{TN}} \tag{38}$$

$$\ln\left(\frac{1}{\left(1 + \frac{C2}{C1}\right)\frac{V_{TN}}{V_o}}\right) > \frac{t_d}{C1R2} \tag{39}$$

$$\ln\left(\frac{1}{\left(1 + \frac{C4}{C3}\right)\frac{V_{TN}}{V_o}}\right) > \frac{t_d}{C3R4} \tag{40}$$

$$C1R2 < t_w \tag{41}$$

$$C3R4 < t_w \tag{42}$$

In this embodiment, it is assumed that "high" level data is set in the node N2, that the alpha particles enter, and that negative charges $I_\alpha$ flow into the node N2. On this assumption, the capacitor 37 at the node N2 is discharged. During this period, the discharge is effected from the capacitor 35 toward the node N2. If R3>R4, the charge stored in the capacitor is discharged through the resistor 32. At the end of the discharge of the capacitor 37, the residual charges in the capacitor 35 reduce to $\exp(-t_d/C3R4)$.

After a period several times the pulse width $t_d$ of the current $I_\alpha$ from the end of the discharge of the capacitor 37, the potential on the node N2 is determined by the charge redistribution of the residual charge in the capacitors 35 and 37. The potential on the node N2 after the charge redistribution is given by $V_oC3$ $e^{-t_d/C3R4}/(C3+C4)$.

As in the manner of the FIG. 3 embodiment, let us have assume that the alpha particles are not destroyed even at the time of their incidence. To meet this condition, the following relation must hold.

$$V_{TN} < V_O C_3 \, e^{-t_d/C_3 R_4}/(C_3+C_4) \quad (43)$$

Figure 7:
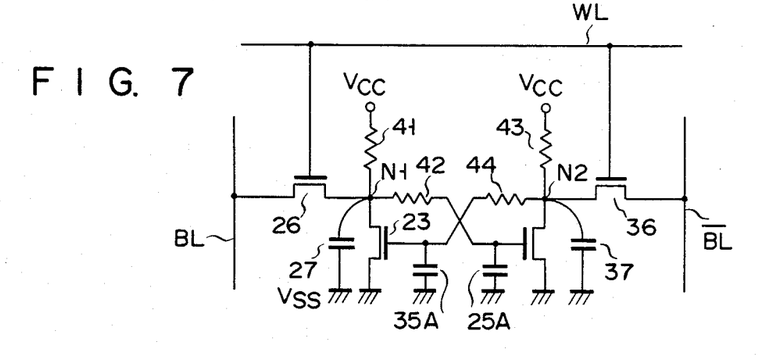

Rearranging this relation (43) in a manner similar to that in which the relation (7) in the FIG. 7 embodiment was modified to yield the relations (11) and (13), we have $$\ln\left(\frac{1}{\left(1+\frac{C_4}{C_3}\right)\frac{V_{TN}}{V_O}}\right) > \frac{t_d}{C_3 R_4} \quad (44)$$

$$\frac{C_4}{C_3} < \frac{V_O - V_{TN}}{V_{TN}} \quad (45)$$

By designing the circuit so as to satisfy relations (44) and (45), the data is not destroyed even if the alpha particles are applied.

Let us consider a case where the "high" level data is held in the node N1. In this case, it is assumed that negative charges, or the current $I_\alpha$, flows into the node N1 upon incidence of the alpha particles. In this case, the charge redistribution after the capacitor is discharged is performed between the two capacitors 25 and 27. The potential on the node N1 after the charge redistribution is
$V_O C_1 \, e^{-t_d/C_1 R_2}/(C_1+C_2)$ If the potential on the node N1 after the redistribution is higher than the minimum potential difference $V_{TN}$, the data in the node N1, as in the case of the node N2, is not destroyed, and thus the high level is maintained. That is, to prevent the data from being destroyed, the following inequality must be satisfied
$V_{TN} < V_O C_1 \, e^{-t_d/C_1 R_2}/(C_1+C_2)$ Rearranging this inequality, we have the following inequalities (46) and (47) corresponding to inequalities (14) and (15)

$$\ln\left(\frac{1}{\left(1+\frac{C_2}{C_1}\right)\frac{V_{TN}}{V_O}}\right) > \frac{t_d}{C_1 R_2} \quad (46)$$

$$\frac{C_2}{C_1} < \frac{V_O - V_{TN}}{V_{TN}} \quad (47)$$

The circuit designed so as to satisfy inequalities (46) and (47) can prevent the data from being destroyed.

The relations (39) and (40) are used to determine the minimum values of the C1R2 and C3R4. If the C1R2 and C3R4 are made excessively large, the data may not be able to be written in the write mode within the write period. Accordingly, to prevent this state, it is necessary to satisfy inequalities (41) and (42) for determining the maximum values of these factors.

The resistors 22 and 32 may be formed by a distributed constant circuit containing the electrodes of the capacitors 25 and 35.

In the FIG. 6 embodiment, the output nodes N1 and N2 of the MOS transistors 23 and 33 are respectively connected through parts of the load resistors, i.e., the load resistor 22 of the resistors 21 and 22 and the load resistor 32 of the resistors 31 and 32, to the gates of the MOS transistors 33 and 23.

FIG. 7 shows a further embodiment of the present invention, in which additional resistors are used instead of the load resistors in the FIG. 6 embodiment. Further, the output node of the MOS transistor is connected to the gate of the MOS transistor.

A resistor 41 connected between the output node N1 of the MOS transistor 23 and the power source voltage $V_{CC}$ is used for the load resistor of the MOS transistor 23. That is, a resistor 42 is formed in an interconnection wiring connecting the output node N1 and the gate of the MOS transistor 33, that is, in a portion of a wiring connecting the output node N1 to the gate of the MOS transistor 33, but excluding the electrode portion of the output node N1 and the gate electrode portion of the MOS transistor 33. A resistor 43 connected between the output node N2 of the MOS transistor 33 and the power source voltage $V_{CC}$ is used for the load resistor of the MOS transistor 33. A resistor 44 is formed in an interconnection wiring connecting the output node N2 to the gate of the MOS transistor 23, viz. a portion of a wiring connecting the output node N2 and the gate of the MOS transistor 23, but excluding the electrode portion of the output node N2 and the gate electrode portion of the MOS transistor 23. The resistances of resistors 41 to 44 are set at R1 to R4 as in each of the above-mentioned embodiments.

Also in the present embodiment, by arranging the circuit so as to satisfy inequalities (44) to (47), the data can be prevented from being destroyed.

In each of the above-mentioned embodiments, a junction of the output node N1 of the MOS transistor 23 and the gate of the MOS transistor 33 is connected to a junction of the output node N2 of the MOS transistor 33 and the gate of the transistor 23 through a resistor formed in a portion of a wiring connecting them, but excluding the electrode portions therein. Alternatively, the resistor can be formed in the gate electrode portion of each of the transistors 23 and 33 in the interconnection wiring, and, through this resistor, the node N1 of the transistor 23 and the gate of the transistor 33 can be connected to the node N2 of the transistor 33 and the gate of the transistor 23.

Figure 8:
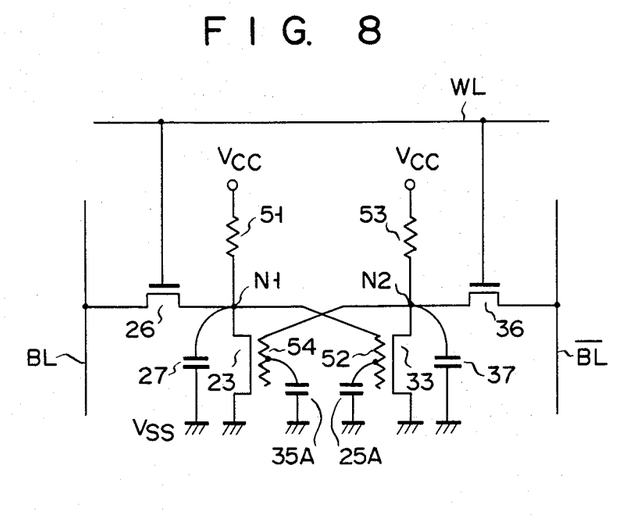

An embodiment implementing such an idea is shown in FIG. 8.

The output node N1 of the transistor 23 is connected to the power source voltage $V_{CC}$ through the resistor 51, and is connected to the gate of the MOS transistor 33 through a resistor 52 formed in the gate electrode portion in the interconnection wiring connecting the node N1 and the gate of the MOS transistor 33. The output node N2 of the transistor 33 is connected through a resistor 53 as a load element to the power source voltage $V_{CC}$, and is connected to the gate of the MOS transistor 23 through the gate electrode portion in the wiring connecting the node N2 and the gate of the MOS transistor 23. The remaining arrangement of this embodiment is the same as that of the FIG. 6 embodiment. No further explanation thereof will be given, and like reference numerals will be used for like portions in FIG. 6. Also in this embodiment, the resistances of the resistors 51 to 54 are set at R1 to R4, as in the above-mentioned embodiments. The circuit is arranged so as to satisfy relations (44) to (47), thereby preventing the occurrence of a soft error. In this embodiment, the resistor 52 formed at the gate electrode node of the MOS transistor 33, together with the capacitor 25, forms a distributed constant circuit, and the resistor 54 formed at the gate electrode of the MOS transistor 23 forms a distributed constant circuit in cooperation with the capacitor 35.

Figure 9:
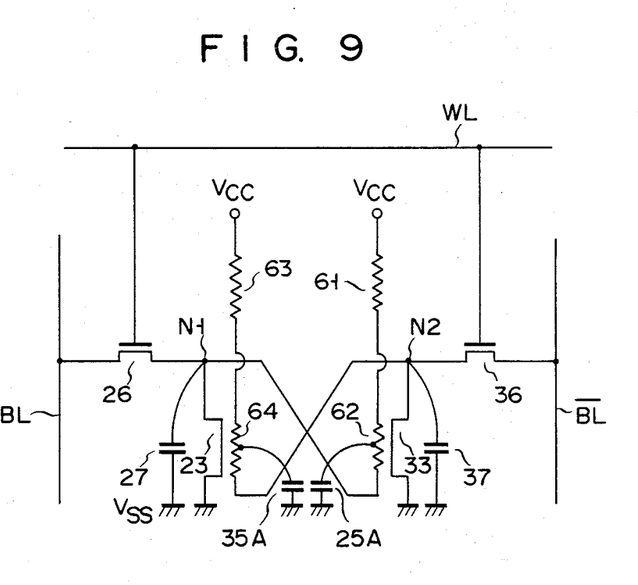

In an embodiment shown in FIG. 9, the output node N1 of the MOS transistor 23 is connected to the power source voltage $V_{CC}$ through a resistor 62 formed in the gate electrode portion in the wiring connecting the node N1 and the gate of the MOS transistor 33, and through a resistor 61 as a load element. The output node N2 of the MOS transistor 33 is connected to the power source voltage $V_{CC}$ through a resistor 64 formed in the gate electrode portion in the wiring connecting the node N2 and the gate of the transistor 23, and through a load resistor 63. The remaining portion of this embodiment is the same as that of FIG. 6 and so, no further explanation will be given. Also in this embodiment, the resistance values of the resistors 61 to 64 are set at R1 to R4, respectively, and the circuit is designed so as to satisfy inequalities (44) to (47), as in the above-mentioned embodiments.

As described above, according to the present invention, no soft error occurs at the time of the incidence of alpha particles, thus providing a highly reliable semiconductor memory device.

What is claimed is:

1. A semiconductor memory device comprising:
a first MOS transistor and a first load resistor connected in series between a power source voltage and a reference voltage;
a second MOS transistor and a second load resistor connected in series between the power source voltage and the reference voltage;
a third resistor whose one end is connected to an output node of said first MOS transistor;
a fourth resistor whose one end is connected to an output node of said second MOS transistor;
first connecting means for interconnecting the output node of said first MOS transistor and the gate of said second MOS transistor;
second connecting means for interconnecting the output node of said second MOS transistor and the gate of said first MOS transistor; and
third and fourth MOS transistors for data transfer in which said third MOS transistor is connected between a first bit line and the output node of said first MOS transistor, said fourth MOS transistor is connected between a second bit line and the output node of said second MOS transistor, and the gates of said third and fourth MOS transistors are connected to a common word line; wherein the following relations hold $$\frac{C2}{C1} < 2 \frac{V_o - V_{TN}}{V_{TN}}$$

$$\ln\left\{\frac{1}{\left(1 + \frac{C2}{2C1}\right)\frac{V_{TN}}{V_o}}\right\} > \frac{t_d}{C1R2}$$

$$C1R2 < t_w$$

wherein
R2: resistance of each of said third and fourth resistors,
C1: capacitance on said gate electrode node,
C2: capacitance on the output electrode node of each of said first and second MOS transistors,
Vo: high level potential on the output electrode node of said first and second MOS transistors,
$V_{TN}$: minimum value of a potential difference appearing between the output nodes of said first and second MOS transistors, with said potential difference the logical "1", "0" states of the output electrode nodes N1 and N2 can return to the steady state;
$t_d$: time until the electric current pulse generated due to the incidence of the high energy particles disappears; and
$t_w$: minimum value of the pulse width of a write designating signal.

2. A semiconductor memory device according to claim 1, wherein said third resistor is formed in an intervening portion between a portion of said first connecting means, which corresponds to the output node of said first MOS transistor, and a portion thereof corresponding to the gate of said second MOS transistor, and said fourth resistor is formed in an intervening portion between a portion of said second connecting means corresponding to the output node of said second MOS transistor and a portion thereof corresponding to the gate of said first MOS transistor.

3. A semiconductor memory device according to claim 1, wherein said third resistor is formed in a portion of said first connecting means corresponding to the gate electrode of said second MOS transistor, and said fourth resistor is formed in a portion of said second connecting means corresponding to the gate electrode of said first MOS transistor.

4. A semiconductor memory device according to claim 2, wherein said first load resistor is connected to the output node of said first MOS transistor through said third resistor formed in the intervening portion in said first connecting means, and said second load resistor is connected to the output node of said second MOS transistor through said fourth resistor formed in said intervening portion in said second connecting means.

5. A semiconductor memory device according to claim 3, wherein said first load resistor is connected to the output node of said first MOS transistor through said third resistor formed in a portion of said first connecting means corresponding to the gate electrode of said second MOS transistor, and said second load resistor is connected to said second MOS transistor through said fourth resistor formed in a portion of said second connecting means corresponding to the gate electrode of said first MOS transistor.

6. A semiconductor memory device according to claim 1, further comprising a first capacitor connected at one end to a junction between said first load resistor and said third resistor and at the other end to the gate of said second MOS transistor, and a second capacitor connected at one end to a junction between said second load resistor and said fourth resistor and at the other end to the gate of said first MOS transistor, a capacitance value of said first and second capacitors each being C1.

7. A semiconductor memory device according to claim 1, further comprising a first capacitor connected at one end to a junction between said first load resistor and said third resistor and at the other end to a potential, and a second capacitor connected at one end to a junction between said second load resistor and said fourth resistor and the other end to a potential, capacitance values of said first and second capacitors each being C1.

8. A semiconductor memory device according to claim 1, further comprising a capacitor provided between a junction of said first load resistor and said third resistor and a junction between said second load resistor and said fourth resistor, a capacitance value of said capacitor being C1.

9. A semiconductor memory device according to claim 1, in which said first load resistor and said third load resistor, and said second load resistor and said fourth resistor are connected to said power source voltage in this order, and when $R1>R2$, $C1R2<t_w$.

10. A semiconductor memory device according to claim 1, wherein said first load resistor and said third resistor, and said second load resistor and said fourth resistor are connected to said power source voltage in this order, and when $R1<R2$, $C1R2<t_w$.

* * * * *